United States Patent
Wang et al.

(10) Patent No.: US 10,457,089 B2
(45) Date of Patent: Oct. 29, 2019

(54) METHOD OF MARKING A SOLID STATE MATERIAL, AND SOLID STATE MATERIALS MARKED ACCORDING TO SUCH A METHOD

(71) Applicant: Master Dynamic Limited, Shatin, New Territories (HK)

(72) Inventors: Yingnan Wang, Shatin (HK); Ching Tom Kong, Pat Heung (HK)

(73) Assignee: Master Dynamic Limited, Shatin (HK)

( * ) Notice: Subject to any disclaimer, the term of this patent is extended or adjusted under 35 U.S.C. 154(b) by 0 days.

(21) Appl. No.: 15/304,843

(22) PCT Filed: Apr. 16, 2015

(86) PCT No.: PCT/CN2015/076803
§ 371 (c)(1),
(2) Date: Oct. 17, 2016

(87) PCT Pub. No.: WO2015/158290
PCT Pub. Date: Oct. 22, 2015

(65) Prior Publication Data
US 2017/0182838 A1 Jun. 29, 2017

(30) Foreign Application Priority Data
Apr. 16, 2014 (HK) .................................... 14103658

(51) Int. Cl.
*B44C 1/22* (2006.01)
*G03F 7/00* (2006.01)
(Continued)

(52) U.S. Cl.
CPC ................ *B44C 1/227* (2013.01); *B28D 5/00* (2013.01); *G03F 7/0002* (2013.01);
(Continued)

(58) Field of Classification Search
None
See application file for complete search history.

(56) References Cited

U.S. PATENT DOCUMENTS 6,358,427 B1 * 3/2002 Smith ...................... B28D 5/00
216/28
2012/0024010 A1 * 2/2012 Maltezos ............... A44C 17/00
63/32

(Continued)

FOREIGN PATENT DOCUMENTS

CN 1264341 A 8/2000
CN 1535213 A 10/2004

(Continued)

OTHER PUBLICATIONS

European Patent Office, "Extended European Search Report" in connection with related European Patent Application No. 15779777.0 dated Oct. 30, 2017, 7 pages.

(Continued)

*Primary Examiner* — Shamim Ahmed
(74) *Attorney, Agent, or Firm* — Kolisch Hartwell, P.C.

(57) ABSTRACT

A method of forming a non-optically detectable identifiable mark at an outer surface of an article formed from a solid state material, said method including the steps of forming a plurality of recesses within a predetermined region of a photoresist 5 applied to an outer surface of an article formed from a solid state material, wherein said plurality of recesses is formed by two-photon absorption lithography and wherein said one or more recesses extend at least partially through the photoresist and from an outer surface of the photoresist and towards said outer surface of the article 10 formed from a solid state material; and applying an etching process such that at least a portion of the outer surface of said article is exposed and etched so as to form a plurality of etched portions extending into said article from the outer (Continued)

surface of the article and corresponding to said plurality of recesses; wherein said predetermined region of said photoresist defines an identifiable mark to be applied to the outer 15 surface of said article; wherein said plurality of etched portions forms the nonoptically identifiable mark on the outer surface of said article; and wherein the maximum width of the etched portions of is less than 200 nm such that the identifiable mark is non-optically detectable in the visible light spectrum.

20 Claims, 7 Drawing Sheets

(51) Int. Cl.
B28D 5/00 (2006.01)
H01J 37/32 (2006.01)

(52) U.S. Cl.
CPC ...... *H01J 37/321* (2013.01); *H01J 37/32192* (2013.01); *G03F 7/00* (2013.01); *H01J 2237/334* (2013.01)

(56) References Cited

U.S. PATENT DOCUMENTS

2012/0112218 A1* 5/2012 Teng ............ H01L 33/38
257/98
2013/0217209 A1* 8/2013 Han ............ H01L 33/007
438/462
2015/0101365 A1* 4/2015 Hui ............ G01J 1/08
63/32
2017/0307537 A1* 10/2017 Yeung ............ G01N 21/87

FOREIGN PATENT DOCUMENTS

| | | |
|---|---|---|
| CN | 101512548 A | 8/2009 |
| CN | 102866580 A | 1/2013 |
| CN | 104575263 A | 4/2015 |
| EP | 2144117 A1 | 1/2010 |
| EP | 2860003 A2 | 4/2015 |
| GB | 2325439 A | 11/1998 |
| GB | 2332651 A | 6/1999 |
| WO | 02066262 A2 | 8/2002 |
| WO | 2012021932 A1 | 2/2012 |
| WO | 2015051640 A1 | 4/2015 |

OTHER PUBLICATIONS

United Kingdom Intellectual Property Office, "Search Report Under Section 72 of the Hong Kong Patents (General) Rules" in connection with related Application No. H600092, dated May 29, 2014, 3 pages.

Li, Yinsuo, Authorized Officer, State Intellectual Property Office of the P.R. China, "International Search Report" in connection with related International Application No. PCT/CN2015/076803, dated Jul. 22, 2015, 4 pages.

Nanoscribe GmbH, "True 3D Laser Lithography" brochure, Jan. 2, 2011, 16 pgs.

* cited by examiner

METHOD OF MARKING A SOLID STATE MATERIAL, AND SOLID STATE MATERIALS MARKED ACCORDING TO SUCH A METHOD

TECHNICAL FIELD

The present invention relates to solid state materials including gemstones, and more particularly the marking thereof.

BACKGROUND OF THE INVENTION

Naturally occurring diamonds have been used as jewellery for many centuries, and each diamond is formed throughout the history and evolution of the Earth, and thus all are unique by nature.

Although there exist many rules or grading systems in judging and assessing the quality of a unique piece or gemstone, it can be difficult to assess the difference between two diamonds or gemstones having similar grading. Thus there exists an importance to allow the marking of a diamond gemstone so as to provide a unique marking to each diamond or gemstone to allow ease of identification and hence tracing.

In gemstone identification and diamond quality grading and analysis, observation and evaluation from a top view normal to the top surface of gemstone or diamond provide relevant evidence and information pertaining to clarity and cut as certified in reports by international standards laboratories including GIA (Gemological Institute of America Inc.), IGI (International Gemological Institute), Gem-A (The Gemmeological Association of Great Britain), NGTC (National Gemstone Testing Center, China) and the like.

From a customer standpoint, parameters such as for a diamond, a flashing brightness often utilizing termed such as "brilliance" (the total amount of light that is reflected by a diamond) or "fire" (the dispersion of light into different colors of light), which are typically observed or admired from a top surface as well as from the top table of a diamond, may be utilised.

It is important parameters of gemstones or diamonds, such as those indicative of the quality, grade, cut, origin, be associated with a gemstone or diamond, for both commercial and security purposes.

Due to the value of a diamond or precious stone varying significantly, and due to the event of theft and counterfeiting thereof, marking should be performed in a manner so that a diamond or precious stone may be identified by a unique identification mark which is indicative of the said diamond or gemstone. Such identification may be utilised for association with known parameters of said diamond or gemstone.

Within the prior art, there exist two main techniques for marking the gemstones and diamonds, these being:
(i) laser marking, and
(ii) FIB (Focused Ion Beam) marking.

For laser marking, this technique is limited by the laser spot size, which typically cannot be utilised for generating fine patterns on diamond surface. The mechanism of laser marking is that the laser energy is absorbed when the laser beam reaches the diamond surface, whereby a portion of the diamond is ablated, leaving a marking that follows the path of a laser beam. Due to the large heat affected zone (HAZ) of laser spot, damage to the diamond may occur from the laser. Although the development of ultra-fast laser offers low pulse energy and high pulse energy density, which result in smaller HAZ, the use of such methods still pose a risk of damage when marking a diamond. Further, the use of such a technique of laser marking does not typically leave a clean surface on a diamond as the ablated surface will result in the formation of graphite irrespective of whether the laser source is excimer laser or picosecond laser or femtosecond laser. Also, in view of the relatively large mark that the laser may form, a resultant darkened mark on the diamond may be quite visible even to the naked eye.

FIB marking, in comparison to laser marking, has several advantages. The spot size is 1000 times smaller than for a laser beam, which makes it possible to mark a surface by writing a higher amount of data. Typically for laser beam marking, it is limited to the formation of some letters, characters and simple logos and the like. The use FIB may allow pictures or representations or Chinese characters, high-resolution brand to be inscribed.

SUMMARY OF THE INVENTION

In a first aspect, the present invention provides a method of forming a non-optically detectable identifiable mark at an outer surface of an article formed from a solid state material, said method including the steps of:

(i) forming a plurality of recesses within a predetermined region of a photoresist applied to an outer surface of an article formed from a solid state material, wherein said plurality of recesses is formed by two-photon absorption lithography and wherein said one or more recesses extend at least partially through the photoresist and from an outer surface of the photoresist and towards said outer surface of the article formed from a solid state material;

(ii) applying an etching process such that at least a portion of the outer surface of said article is exposed and etched so as to form a plurality of etched portions extending into said article from the outer surface of the article and corresponding to said plurality of recesses;

wherein said predetermined region of said photoresist defines an identifiable mark to be applied to the outer surface of said article; wherein said plurality of etched portions forms the non-optically identifiable mark on the outer surface of said article; and wherein the maximum width of the etched portions of is less than 200 nm such that the identifiable mark is non-optically detectable in the visible light spectrum.

In an embodiment of the invention, one or more of the recesses of said plurality of recesses extend through the photoresist and so as to provide one or more apertures therethrough and providing one or more exposed portions of said outer surface of the article prior to application of the etching process, such that etched portions corresponding to the one or more apertures have depths into the article of approximately the same depth.

In another embodiment of the invention, the recesses extend through the photoresist at varying depths to each other prior to application of the etching process, such that the etched portions have varying depths into the article.

Preferably, the photoresist has a thickness in the range of from 10 nm to 500 μm, and said recesses have a maximum width of in the range of from 10 nm to 200 nm or less.

Preferably the etched portions have a depth in the range of about 5 nm to about 30 nm.

The recesses of said plurality of recesses may be arranged in a non-period and non-uniform arrangement with respect to each other within said predetermined region of a photoresist.

The photoresist may be of uniform thickness, or alternatively the photoresist may have a non-uniform thickness.

The recesses of said plurality of recesses may be of the same width, or alternatively the recesses of the plurality of recesses may have non-uniform widths. One or more recess is formed from a plurality of adjacent recesses.

The etching process may be a plasma etching process, and may be an Aspect Ratio Dependent Etching (ARDE) microwave plasma etching. Radio Frequency (RF) bias is applied during such an etching process.

The etching process may alternatively be a Reactive Ion Etch (RIE) process, an Inductively-Coupled Plasma (ICP) etching process, a Focused Ion Beam (FIB) etching process, or a Helium Ion Microscope (HIM) etching process.

The solid state material may selected from the group including gemstones, and may be diamond.

Alternatively, the solid state material may include pearl, silicon, synthetic sapphire or the like.

The solid state material may be a sapphire based material, and the etching process includes the presence of Chlorine gas, Boron TriChloride ($BCl_3$) gas, or combinations thereof.

In an embodiment of the invention, the non-optically identifiable mark may be formed at the outer surface of the article in a predetermined spatial arrangement with respect to an optically identifiable mark formed on the outer surface of said article, wherein the detection of the optically detectable mark allows for subsequent detection of the non-optical mark by reference to said predetermined spatial arrangement.

The non-optically identifiable mark may be formed at the outer surface of the article in a predetermined spatial arrangement with an optically identifiable attribute of the article, wherein said spatial arrangement with an optically identifiable attribute of the article allows for subsequent detection of the non-optical mark by reference to said predetermined spatial arrangement in reference to said optically identifiable attribute of the article.

The identifiable mark is non-optically detectable in the visible light spectrum and is viewable in the ultra-violet (UV) spectrum, and the identifiable mark may be viewable by way of Differential Interference Contrast (DIC) microscopy, Scanning Electron Microscopy or the like.

In a second aspect, the present invention provides an article formed from solid state material having a non-optically detectable identifiable mark thereon, wherein said non-optically detectable identifiable mark is applied to said solid state material by the method according to the first aspect.

The solid state material is selected from the group including gemstones, and may be diamond.

Alternatively, the solid state material includes pearl, silicon, synthetic sapphire or the like.

The non-optically detectable identifiable mark is non-optically detectable in the visible light spectrum is viewable in the ultra-violet (UV) spectrum, and may be viewable by way of Differential Interference Contrast (DIC) microscopy, Scanning Electron Microscopy (SEM) or the like.

The non-optically identifiable mark may be formed at the outer surface of the article in a predetermined spatial arrangement with respect to an optically identifiable mark formed on the outer surface of said article, wherein the detection of the optically detectable mark allows for subsequent detection of the non-optical mark by reference to said predetermined spatial arrangement.

The non-optically identifiable mark is formed at the outer surface of the article in a predetermined spatial arrangement with an optically identifiable attribute of the article, wherein said spatial arrangement with an optically identifiable attribute of the article allows for subsequent detection of the non-optical mark by reference to said predetermined spatial arrangement in reference to said optically identifiable attribute of the article.

BRIEF DESCRIPTION OF THE DRAWINGS

Embodiments and particulars of the present invention will now be described by way of example only and with reference to the accompanying drawings, in which:

FIG. 5b depicts an enlarged view of a mark portion of the diamond in the embodiment as shown in FIG. 5a;

DETAILED DESCRIPTION OF THE DRAWINGS

Figure 1A:
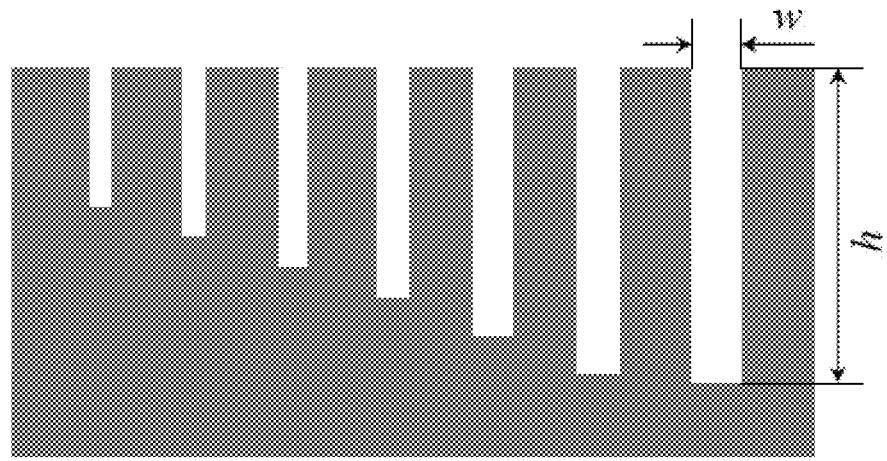
FIG. 1a schematically depicts the effect of aspect ratio dependent etching (ARDE) showing etching depth variation with aspect ratio.

The present invention seeks to a method that combines two-photon absorption lithography and plasma etching, which can generate a mark on a solid state material, including gemstones and such solid state materials include those such as diamond, pearl, silicon, sapphire, synthetic sapphire, sapphire based materials or the like, consisting of an invisible mark to visible light, which is termed an "invisible marking".

The present invention allows for the marking of such an article with a non-optically detectable identifiable mark by forming a plurality of recesses in a predetermined region of a photoresist applied to an outer surface of an article formed from a solid state material by two-photon absorption lithography.

The plurality of recesses extend from the outer surface of the photoresist, which may extend all the way though the photoresist to the surface of the article to be marked.

In embodiments of the invention, one plurality of recesses formed by two-photon absorption lithography may extend through the photoresist so as to provide apertures therethrough, and provide corresponding exposed portions of the surface of the solid state article to which the marking is to be applied.

In other embodiments of the invention, a combination of recesses and apertures may be provided.

Following the formation of recesses and/or apertures, an etching process is utilised, so as to form a plurality of etched portions extending into the article from the outer surface of the article on the outer surface of the article.

Different etching processes may be utilised, including plasma etching processes such as ARDE microwave plasma etching.

The invention is useful for marking of solid state materials including gemstones, diamonds, pearl, sapphire, synthetic sapphire, silicon or silicon based materials and the like.

A predetermined region of the photoresist defines the identifiable mark to be applied to the outer surface of the article, and the plurality of etched portions forms the non-optically identifiable mark on the outer surface of the article; and wherein the maximum width of the etched portions of is less than such that the identifiable mark is non-optically detectable in the visible light spectrum.

The mark, due to its non-optical detectability in the visible light spectrum, may be detected by way of application of ultra-violet (UV) light and viewing by Differential Interference Contrast (DIC) microscopy, Scanning Electron Microscopy (SEM) or the like.

Due to the invisibility of the identifiable mark and small size and associated difficulty in detection, it may be required that a reference datum be provided in a known spatial relationship to the invisible mark. This may be provided by way of a further mark which is optically detectable yet also does not adversely impact upon the article to which it is applied. The invisible mark may be spaced apart, partially overlayed, or fully overlayed with such an optically detectable mark. The identification of the optically identifiable mark then allows location and viewing of the non-optically identifiable invisible mark by techniques including those as discussed above, due to the known relationship between the optically and non-optically identifiable marks. Alternatively, another example of such a datum, may be a known physical landmark of the article from which the invisible mark is in a known spatial relationship, for detection and viewing.

Such marking in accordance with the present invention, where applied to solid state materials including precious stones, gemstone, diamonds or the like, may be used for security identification which may include an identification specific to the marked article, or a branding type mark. This may be useful in applications including in anti-counterfeiting type purposes, identification type purposes to determine if an article is that of which it is purported to be, and identification purposes in the event of theft or impropriety, for example.

Such an invisible marking in accordance with the present invention, when applied to solid state articles such as precious stones or the like, must not interfere with the optical properties of the article, and the process utilised for the application of such a mark must not damage the article or impact upon the visual properties of such an article so as not to affect the value or quality.

By way of background, in respect of marking of such solid state articles, there are typically two types of marks utilised to form a mark thereon for identification purposes such as proving an anti-counterfeiting mark or the like, these being:
(a) a "visible mark" that can be seen utilising a loupe or microscope, and
(b) an "invisible mark" which may be considered to contain hidden information or a hidden message, and which requires detection and viewing by other techniques such as differential interference contrast (DIC) microscopy in order to be seen. The invisible mark, composed of shallow and small features, which can be observed under UV light illumination with DIC microscopy, Scanning Electron Microscopy (SEM) or the like may be utilised.

By way of explanation, DIC microscopy is an optical microscopy illumination technique used to enhance the contrast in unstained, transparent samples or articles. DIC works on the principle of interferometry to gain information about the small optical path length difference of the sample having such a mark in order to see otherwise invisible features.

For invisible mark design as in the present invention, Rayleigh criterion is needed to be taken into consideration. In the case of providing a mark invisible under microscope with visible light, the feature size must be smaller than the microscope resolution R. As known in the art, the resolution R follows the rule that the numerical apertures (NAs) of both the objective and the condenser should be as high as possible for maximum resolution.

In the case that both NAs are the same, the resolution may be simplified as $R=0.61\lambda/NA$, where $\lambda$ is the wavelength of the light source. In the visible light spectrum, the best resolution for a microscope is around 200 nm. Thus, the feature size of an invisible mark should typically be smaller than 200 nm, that is the maximum width of any recess forming an invisible mark should be less than 200 nm. To observe these invisible features under microscope, UV illumination is needed.

Figure 1B:
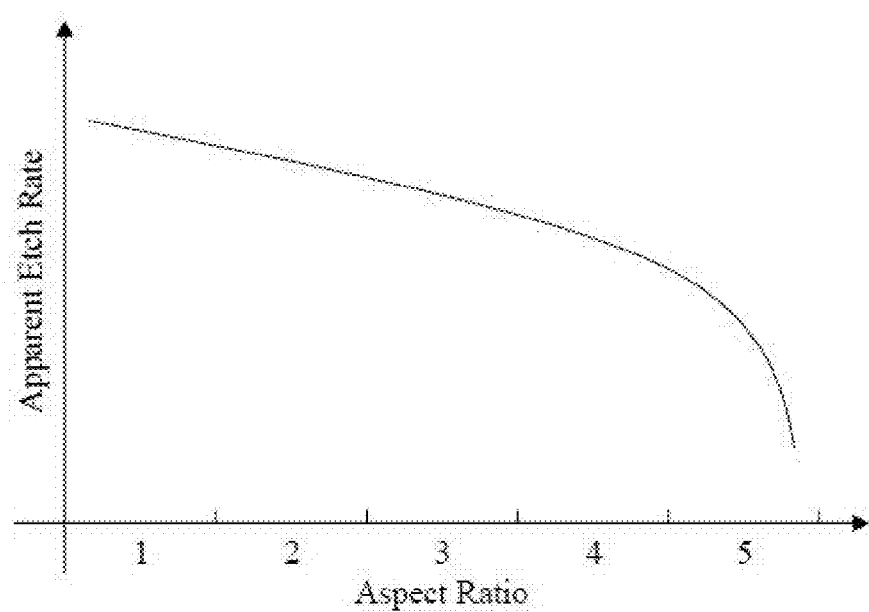
FIG. 1b shows the sequential etching rate variation with aspect ratio.

Referring to FIG. 1a and FIG. 1b, and illustrative example of the mechanisms of aspect ratio dependent etching (ARDE). The aspect ratio dependent etching (ARDE), refers to the phenomenon whereby the etch rate scales not with not absolute feature sizes, but rather with the aspect ratio. Generally, increasing aspect ratio decreases etch rate, which is caused by reduced transport of reactive species in deep and narrow structures.

As shown in FIG. 1a, the effect of ARDE is demonstrated and FIG. 1b illustrated the etching rate versus aspect ratio. It has been shown that this phenomenon is especially significant when a feature has a size in the range of from 0.4 to 20 μm, whereby the etching rate differs by about 40%. Thus, as will be understood, trenches having wide notches have higher etching rate than that of narrow notches.

Figure 2:
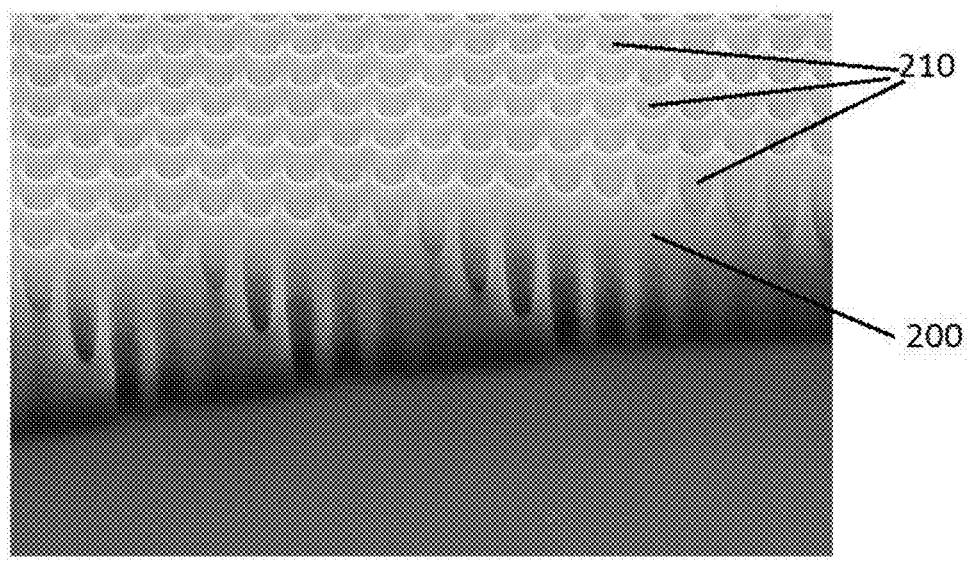
FIG. 2 is an SEM image showing a photoresist with apertures formed by way of two-photo absorption.

Referring to FIG. 2, there is shown an example of a photoresist 200 having a plurality of apertures 210. The apertures 210 in this example in accordance with the present invention extendi through the photoresist 200 were formed by way of two-photo absorption in accordance with the present invention. The diameter of the round hole apertures is about 200 nm, this size of aperture 210 being applicable to the requirements of the present invention as claimed and as described.

In this example, Nanoscribe equipment was utilised to provide two-photo absorption in accordance with the present invention as shown in FIG. 2. Such equipment by Nanoscribe (www.nanoscribe.de) can provide a 2D feature size as small as 100 nm. Although the apertures are shown in FIG. 2 as being in a uniform arrangement, the present invention does not require periodicity or uniformity of aperture and hence recess distribution for generation of the marking, and non-uniform or randomly distributed apertures are equally as applicable.

Features may have a maximum width of in the range of from 10 nm to 200 nm, and typically features having a maximum width of 50 nm may be achieved.

Figure 3:
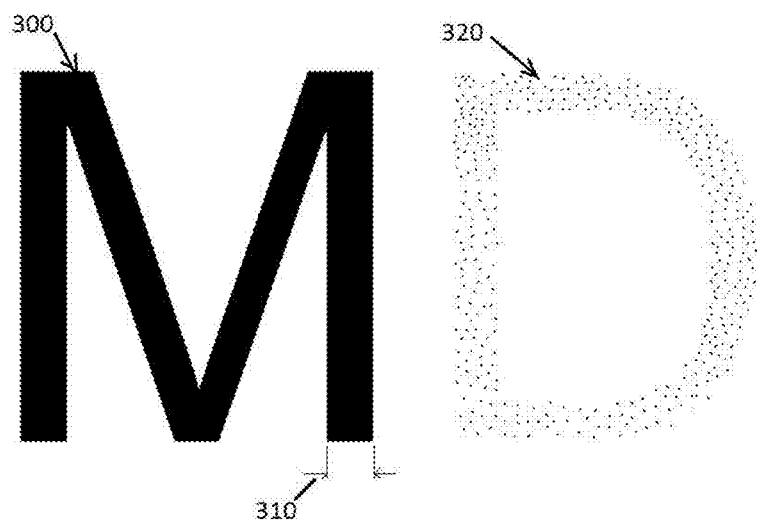
FIG. 3 is a schematic representation of an optically visible mark in combination with a non-optically visible make according to the present invention.

Referring to FIG. 3, there is depicted a schematic representation of a layout of an optically visible mark 300 in combination with a non-optically visible mark 320, which may be applied to the surface of an article such as a gemstone or the like in accordance with the present invention.

In this schematic representation, the dimension of the patterns of the marks are not to scale with reference to the sizing of the following detailed description of the invention.

Note, this representation of a layout for a mark is not a photoresist material or a mark which has applied to an article, but rather a schematic layout for applying both an optically and a non-optically identifiable mark to an article in accordance with the present embodiment.

The optically visible mark 300 is shown as represented by a uniform width line, while the non-optically visible mark 320 is represented by a plurality or randomly distributed dots.

The letter "M" 300 which represents an optically visible mark 300 and is not filled with any pattern or the like. The line width of the optically visible mark representation 300 in this example is 5 μm. In alternate embodiments of the invention, the optically visible mark may be formed by a periodic structure of small feature size.

The non-optically visible mark 320 as represented by a random distribution of dots in the form of a letter "D" 320, whereby such dots with diameters which are less than 200 nm. The dots which fill the letter "D" are invisible to visible light, but visible to UV light, so as to make it an invisible mark.

As will be understood, although the random distributed pattern can be any shape than round dot, round is a preferred shape, which may provide ease of writing of a pattern by way of a laser beam.

In this example, diameters of the dots are the same, for convenience of the forming of apertures through a photoresist by two-photon absorption lithography such as by Nanoscribe equipment, as it would be required utilise only one fixed parameter for writing of the apertures. As will be understood by those skilled in the art, the diameter of the apertures may be set to be different from each other in other or alternate embodiments, provided the diameter is less than 200 nm.

It should be noted that in this example, that both an optically visible mark 300 is to be formed in association with a non-optically visible mark 320. Due to a non-optically visible mark 320 being effectively "invisible" and extremely small with respect to the surface of an article to which it is applied, locating such a non-optically visible mark 320 may be very difficult without any reference point.

As such, in the present example, an optically visible mark 300 is used in conjunction with a non-optically visible mark 320, and detection of the optically visible mark 300 that indicates the location of the non-optically visible mark 320 due to known spatial relationship between the two marks.

As mentioned above, the scale and size of the optically visible mark 300 and the non-optically visible mark 320 are not to scale, and are shown to be the same size and immediately adjacent to each other as arbitrary demonstrative parameters. As will be appreciate, in other and alternate embodiments the optically visible mark 300 and the non-optically visible mark 320 could be differently sized to each other, could be spaced apart differently, and in some cases could overlap with each other.

Also, as must be understood, although letters have been used in the present example of the optically visible mark 300 and the non-optically visible mark 320, other symbols indicative of data could be utilised. In this example, the optically visible mark 300 is shown as an example of how the non-optically visible mark 320 could be located on an article.

In other examples, the non-optically identifiable mark 320 may be located at the outer surface of the article in a predetermined spatial arrangement with an optically identifiable attribute of the article, and the spatial arrangement with an optically identifiable attribute of the article may allow for subsequent detection of the non-optical mark 320 by reference to the predetermined spatial arrangement in reference to optically identifiable attribute of the article.

For example, the optically identifiable attribute could be a feature or landmark on an article, such as a corner, protrusion, vertex of a facet of a gemstone of the like. However, as will be appreciated and understood by those skilled in the art, such identifiable attributes are numerous, and the predetermined spatial arrangement could be in relation to two or more such attributes.

Referring to FIGS. 4a, 4b, 4c and 4d, there is depicted a schematic representation of the application of an optically identifiable mark and a non-optically identifiable mark to an article in accordance with the present invention.

In the example as depicted and described with reference to FIGS. 4a, 4b, 4c and 4d, the combination of the optically visible mark 300 and the non-optically visible mark 320 of FIG. 3 is applied to an article.

Figure 4A:
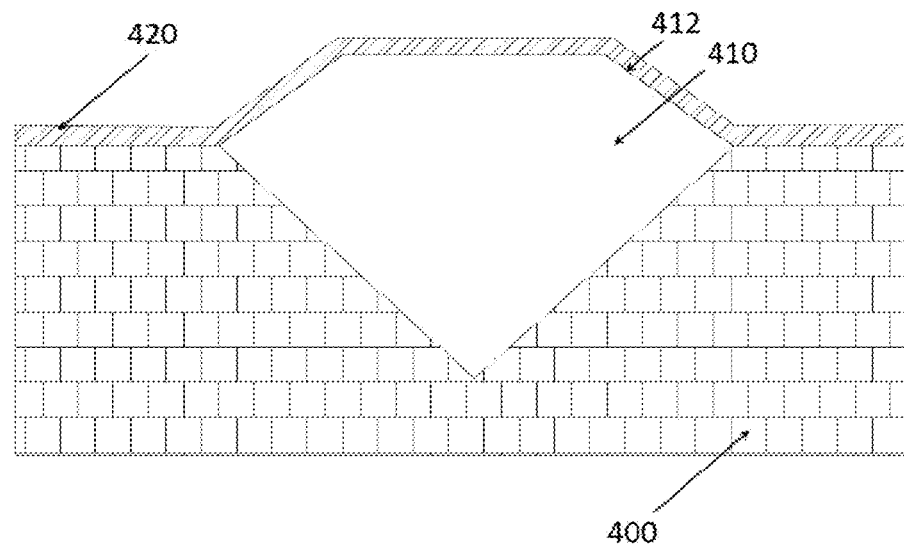
FIG. 4a is a cross-sectional view of a holder supporting a diamond having its top surface coated with photoresist, to be marked with the optically identifiable mark and a non-optically identifiable mark as depicted with reference to FIG. 3, in accordance with the present invention, the cross-sectional view being through line A-A of FIG. 4d viewed in the direction of Arrow B.
Figure 4B:
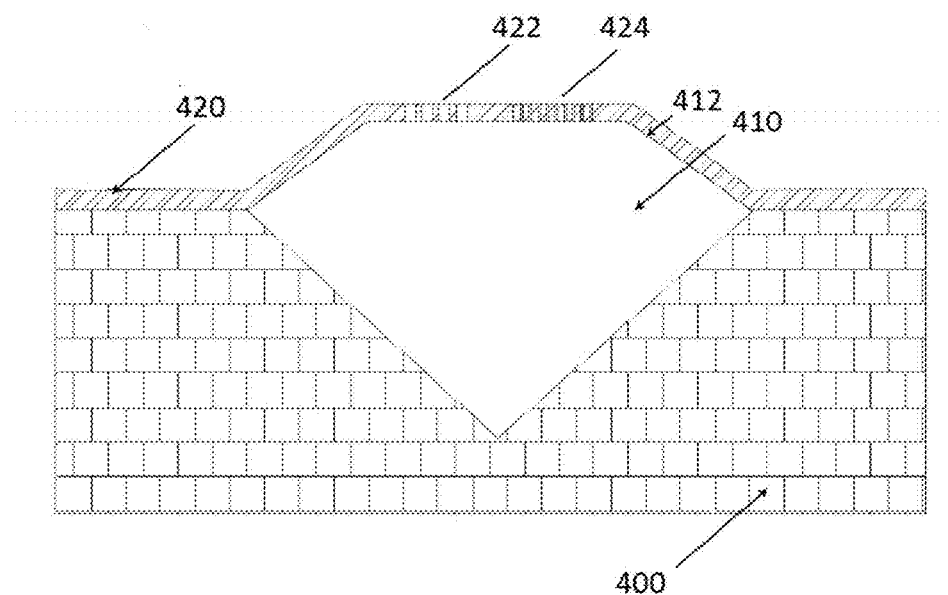
FIG. 4b is the cross-sectional view of FIG. 4a through line A-A of FIG. 4d, upon apertures being formed through the photoresist so as to expose portions of the top surface of the diamond.
Figure 4C:
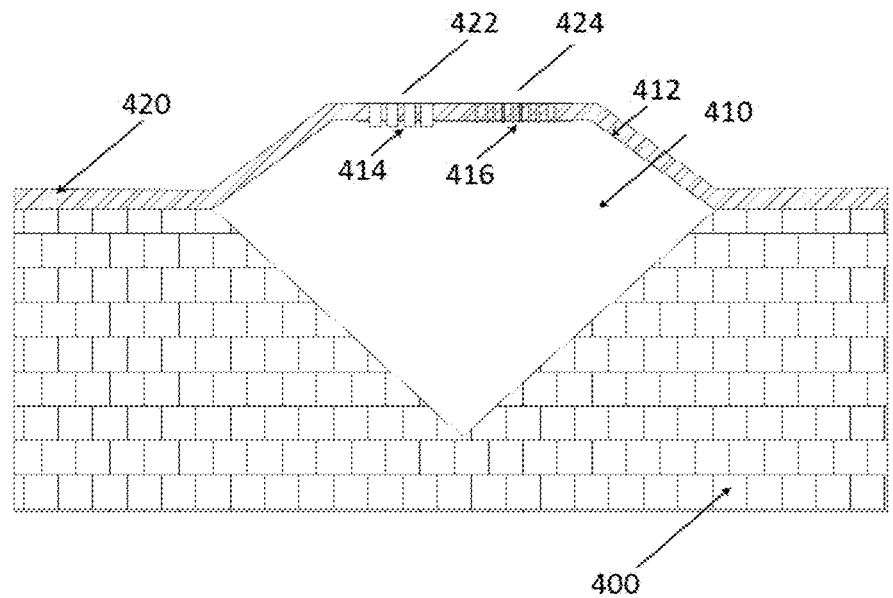
FIG. 4c is a cross-sectional view of FIG. 4b through line A-A of FIG. 4d, upon recesses being formed into the top surface of the diamond.
Figure 4D:
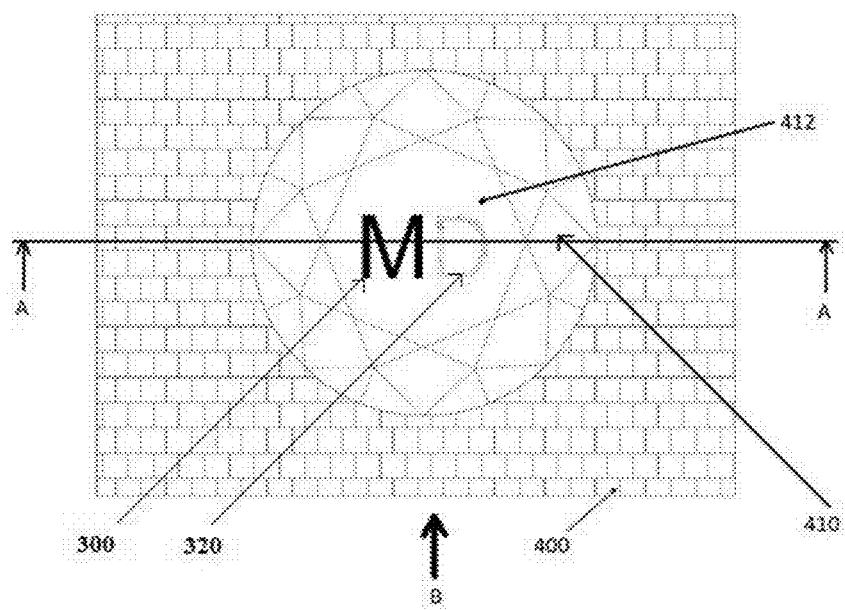
FIG. 4d is a top view of the diamond and holder of FIG. 4a, FIG. 4b and of FIG. 4c upon removal of the photo resist so as to reveal an optically identifiable mark and a non-optically identifiable mark according to the present invention.

The cross-sectional views of FIGS. 4a, 4b, 4c are through line A-A of FIG. 4d viewed in the direction of Arrow B. Reference is made to the optically visible mark 300 and the non-optically visible mark 320 as described in reference to FIG. 3, whereby the representation of FIG. 3 extends into the page.

Referring to FIG. 4a, there is shown a schematic representation cross-sectional view, whereby there is depicted a holder 400 upon which is supported an article, in this case a diamond 410 to which the optically visible mark 300 and the non-optically visible mark 320 as described in reference to FIG. 3 is to be applied.

As shown, prior to the formation of apertures as discussed above in accordance with the invention, by way of pattern writing utilising two-photon absorption lithography utilising equipment such as that of Nanoscribe as described above, the diamond 410 is fixed in the holder 400, after which the surface 412 of the diamond 410 is coated with thick photoresist 420, for example of a thickness 2 μm. In the following description, 2 μm is used instead of 10 μm, although 100 μm is also possible for pattern writing, in accordance with the invention.

For such a process of providing apertures through the photoresist, in order to utilise relevant parameters for the right dose of exposure, in such an example there are 5 main parameters to be tuned, including:
  (i) scan speed,
  (ii) laser power,
  (iii) voxel distance,
  (iv) voxel number, and
  (v) z-offset.

For a 2 μm thick photoresist, one voxel is typically sufficient for the photoresist to be written through and as such, I this example the voxel number and voxel distance are not necessary to be taken into consideration.

Furthermore, as the photoresist is sufficiently thin enough, the voxel z-offset may be set to be zero. As such, in this example of the invention there are only two parameters to be considered and, thus the optimized combination of scan speed and laser power may be readily determined.

In the present example, the cross-sectional views of FIGS. 4b and 4c are in a direction such that the representations of the combination of the optically visible mark 300 and the non-optically visible mark 320 of FIG. 3 which extend into the page extend into the surface 412 of the diamond 410.

As shown in FIG. 4b, by way of example, when the photoresist 420 coated diamond 410 is processed with two-photon absorption lithography and developed in developer the diamond surface 412 is exposed in the area of "M" 422 and the apertures in "D" 424 of the representation of FIG. 3. In this example, the aspect ratio for "M" 422 is 2 μm/10 μm=0.5, and for the holes in relation to "D" 424 is 2 μm/200 nm=10. Referring to FIG. 4c, the aspect ratio difference is sufficiently high to generate an etching depth difference in the upper surface 412 of the diamond 410 adjacent apertures 422 and apertures 424 in the following plasma etching process, such that an optically visible mark in relation to the M and a non-optically visible mark in relation to the D are formed whereby recesses 414 are formed in the surface 412 of the diamond 410 adjacent apertures 422, and whereby recesses 416 are formed in the surface 412 of the diamond 410 adjacent apertures 424.

During the two-photon absorption lithography process, the laser focus will focus into the photoresist, and scan layer by layer. In the area of the photoresist to be exposed, the shutter will open and the laser beam will dwell for a sufficient long time, normally several hundred μs.

With reference to FIG. 5a-5d, there is shown a further embodiment of the invention. As shown, a diamond 510 is provided in a holder 500 with a photoresist 520 applied thereto in reference to an embodiment of a mark in the region "M".

In the present embodiment, the process and description in reference to FIG. 4a-4d may be considered applicable to the mark "D", however reference to the mark "M" in reference to FIGS. 4a-4d must not be considered applicable to the present embodiment as herein described with referenced to FIGS. 5a-5d.

Figure 5A:
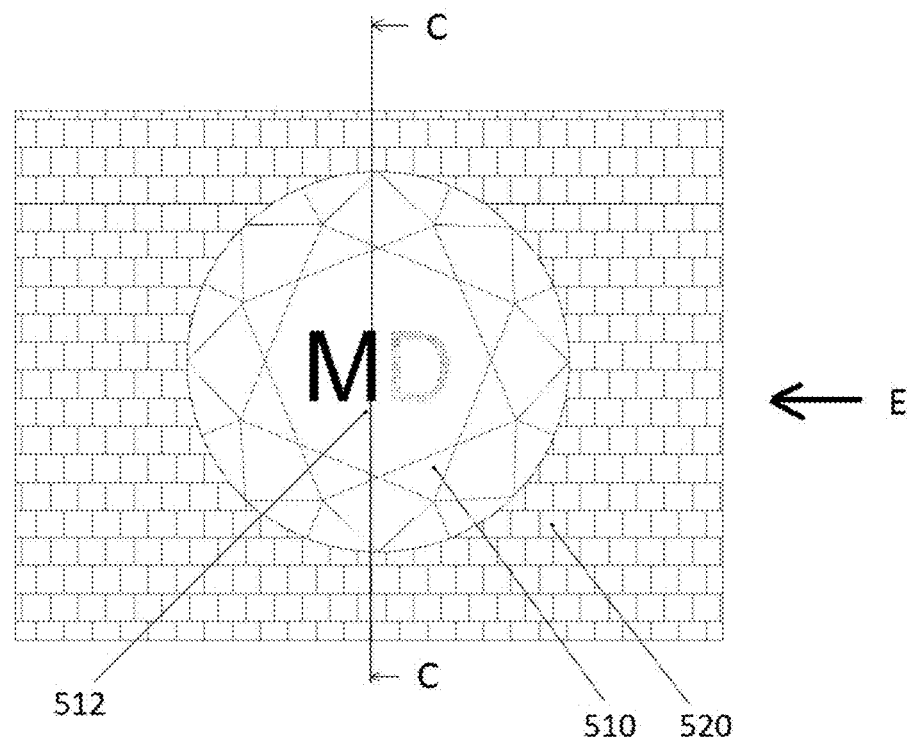
FIG. 5a depicts a top view of the diamond and holder of a further embodiment of the invention.
Figure 5B:
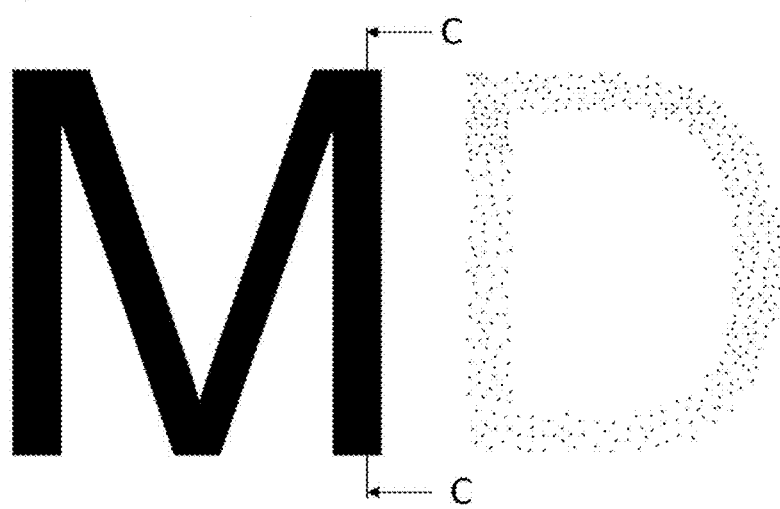
Figure 5C:
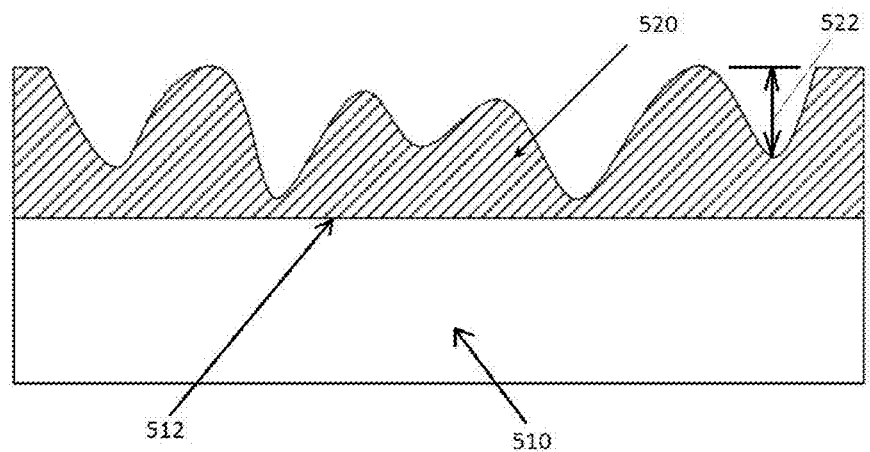
FIG. 5c depicts a cross-sectional view along the line C-C in the direction E as shown in FIG. 5a and FIG. 5b with a photoresist after developing and prior to removal.

In the present embodiment, two-photon absorption lithography is utilised so as to generate 3D pattern in the photoresist 520 as shown in FIG. 5c This adjustability of the aspect ratio over the whole pattern design as shown by the varying depth of etching and trench depth 522 in the photoresist 520 along line C-C of the "M" pattern. In the present embodiment, In order to have a sufficiently high aspect ratio difference, the diamond surface 512 is coated with thick photoresist, for example 10 μm During the two-photon absorption lithography process, the laser focus will focus into the photoresist 520, and scan layer by layer. In the area of the photoresist to be exposed, the shutter will open and the laser beam will dwell for a sufficient long time, typically several hundred μs.

Thus, the present invention can be seen that the thickness of the exposed photoresist varies according to the design resulting in recesses in the photoresist of differing depths, so as to provide different aspect ratios within the photoresist 520. As shown the linewidth is the same along "M", but the trench depth of the recesses is different, thus the aspect ratio along "M" is different as depicted in the drawings.

After developing as shown in FIG. 5c, the aspect ratio for "M" varies from 2 μm/5 μm=0.4 to 10 μm/5 μm=2 in this example.

Figure 5D:
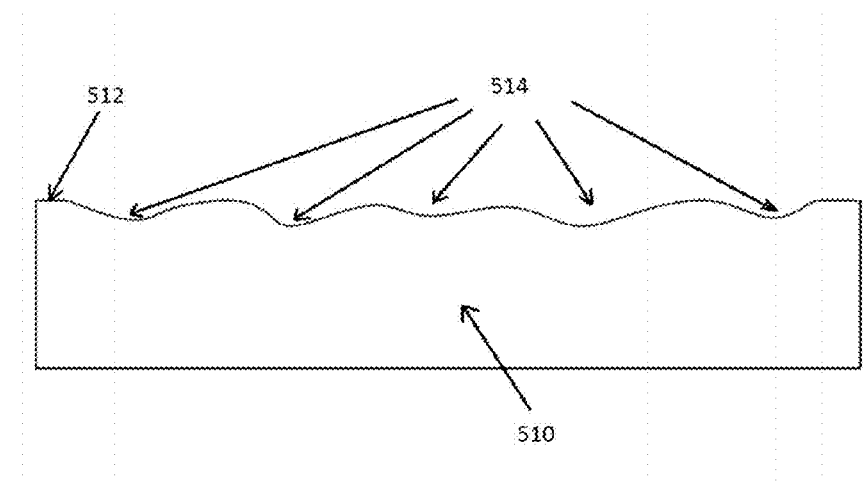
FIG. 5d depicts the cross-sectional view of FIG. 5d upon removal of the photoresist after etching.

As shown in FIG. 5d, the cross section of the local area of the etched diamond 510 following an etching process along section line C-C viewed in the direction E is shown and different levels of patterns from etched portions 514 corresponding to the recesses in the photoresist 520 extending into the surface 512 of the diamond 510 can be observed using a suitable viewing methodology and apparatus, such as under DIC microscopy, SEM or the like. This provides for an invisible mark or hidden message which is not detectable for visible light. Depending on the etching depth, the observation under UV light may require DIC microscopy to enhance the contrast.

With reference to plasma etching, types of etching include RIE or ICP etching. In reference to the present example of the invention and as used in reference to FIG. 2, a preferred etching process is microwave plasma etching, and as referred to above an appropriate technology for utilisation in the present invention includes that from Muegge (www.m-uegge.de).

This technology is composed of a microwave plasma source and an RF power source. The RF power source is used for accelerating ions generated by the microwave plasma source. The plasma generated with this technology is cold plasma, having a temperature which is significantly lower than the reaction temperature between the ions and the diamond, however the ions may react with the photoresist Such technology offers the advantage that in embodiments of the invention the exposed diamond surface may be cleaned in the machine first before turning on the RF power to etch the diamond. Any possible photoresist residual on the exposed area of the diamond surface or subsequent etching after development and formation of the apertures may be fully removed, without damaging the diamond itself, so as to mitigate the introduction of any defect resulting from the photolithography process.

The process gases used in cleaning are Nitrogen, Oxygen and $CF_4$, with process pressure over 150 mT. When the photoresist residue on the exposed area is totally removed, the RF power may be subsequently turned on, after which the accelerated ions commence attack of the diamond surface, causing the requisite recesses to be formed thus creating the mark on the diamond. Typically, a 30 nm etching depth may be reached in "M" optically visible mark within 4 min, with less than 10 nm variation due to the aspect ratio difference according to the design.

When the diamond is etched to the requisite depth, the RF power is turned off again, and the cold plasma will remove all the photoresist on the diamond surface, resulting in a clean marked surface after the whole process, as shown and described in reference to the above.

With reference to the present invention, for a feature size of 200 nm, this is not practical for UV photolithography, and such a feature may only be generated by techniques including e-beam lithography, X-ray lithography, laser interference lithography or two-photon absorption lithography. E-beam lithography is typically considered prohibitively costly and prohibitively slow for industry. Regarding X-ray lithography, this relies too much on the limited X-ray source, which can only be generated by Synchronous Radiation, thus again is prohibitively expensive.

Laser interference lithography typically does not allow for the readily casting of a desired pattern to the photoresist as shadow mask assistance is required which increases complexity of the fabrication process. Furthermore, a pattern generated by laser interference is always periodic, thus providing a pattern which is a grating structure regardless of small the period is. This will in turn result in a mark which will diffract visible light to make the pattern itself visible, as long as the illumination is sufficiently strong. As such, laser interference lithography does not allow for the generation of an optically invisible mark in contrast to the present invention.

In contrast to laser interference lithography, two-photo absorption lithography as utilised in the present invention, a two-photon polymerization process which can write 3D features in both positive and negative photoresist is used. Thus, it is possible and practical to write small patterns, such as round dots or other shapes which are smaller than 200 nm, and which are randomly distributed in a predetermined area so as to allow the formation of an invisible mark in accordance with the present invention.

A two-photon absorption technique, such as that of Nanoscribe (www.nanoscribe.de), allows the formation of feature size can reach as small as 100 nm, which provides a suitable method for transferring an invisible mark pattern to a photoresist. Furthermore, two-photon absorption as utilised in the present invention provides a writing speed which reaches several cm/s, such as provided by Nanoscribe equipment. This high writing speed allows the writing of the visible mark directly with two-photo absorption lithography in accordance with the present invention. Thus, the whole pattern may be directly written on the photoresist layer by layer in one laser beam scan in a time in the range of a few seconds to several minutes, depending on the complexity of the overall pattern.

Whilst due to developments in the IC industry, plasma etching may be considered relatively mature, however as demonstrated in respect of the present invention, such a technique may be used in relation to diamond as well as Silicon and other polymers.

Plasma etching is an aspect ratio dependent etch (ARDE). ARDE refers to the phenomenon that the etch rate scales not with with not absolute feature sizes, but with the aspect ratio. Increasing aspect ratio usually decrease etch rate, which is caused by a reduced transport of reactive species in deep and narrow structures.

The incorporation of the optically visible mark, in embodiments of the invention, in addition to offering general information regarding the article itself, also provides assistance in locating the small invisible mark of the invention on the relatively large diamond surface. Without the visible mark, it would be quite difficult to locate the invisible mark.

In addition to the advantages as provided by the present invention above, the present invention provides the following:

(i) a marking which is not unsightly and which may not be readily viewed without the knowledge of the specific parameters for viewing or the location of such a marking;

(ii) a marking which, when applied to articles such as precious stones or gemstones, allows for the identification for security purposes as well as tracking and origin of the articles;

(iii) security purposes, which may be utilised to mitigate or identify counterfeiting, and impropriety including theft and the like;

(iv) marking of a solid state material, without the disadvantages associated with destructive and invasive methods of marking such as etching, ablation, milling, engraving and the like;

(v) a methodology and product thereof which does not alter the optical qualities or properties of a solid state material, and which is not detrimental to the clarity or colour of the solid state material;

(vi) a methodology and product thereof, which does not introduce contaminants or impurities to the solid state material (vii) a methodology and product thereof that requires no significant removal of material from the surface of the solid state material; and (viii) a methodology and product thereof, having no associated chemical residue Plasma etching, due to evolution in the integrated circuit (IC) industry, is a technique known. In typical reactive ion etching (RIE) processes, large numbers of ions are produced that are accelerated towards the target, which results in the physical removal of material by sputtering and related processes. Such a process is known to have low selectivity.

In contrast to RIE, inductively-coupled plasma (ICP) etching is a largely chemical process in which a plasma is used to breakdown the etching gases into a mixture of free radicals (i.e. neutral species) and ions (i.e. charged species). ICP etching is largely a chemical etching process, rather than a process of physical ablation as with RIE, and thus may be considered to provide a higher selectivity.

Although RIE and ICP are different in etching techniques, they share in common aspect ratio dependent etch (ARDE). ARDE refers to the phenomenon that the etch rate scales do define not absolute feature sizes, but rather etch rate scales are defined with aspect ratio. Increasing the aspect ratio typically decrease etch rate due to a reduced transport of reactive species in deep and narrow structures.

For diamond marking, the etching depth is generally very small, typically in the range of 10 nm to 50 nm. In order to provide a fine etched pattern, a protection layer is typically generated by using UV photolithography with photoresist.

There are two main methods for coating the photoresist on the diamond surface, spin coating and spray coating. Regardless of which method the photoresist is coated on the diamond surface, the photoresist layer thickness is substantially uniform across the whole diamond surface, in view of a diamond surface area being relatively small, typically only several $mm^2$. The photoresist thickness is typically in the range of several microns, which is hundreds of times that of the etching depth. As such, for the pattern design for a marking having a different line width, the aspect ratio difference is mainly the result of photoresist thickness over a pattern line width.

According to experimental results in respect of the present invention, for a given design with line width ranging from 200 nm to 10 μm, the etching depth difference is quite high with 2 μm photoresist protection during the plasma etching. When the 10 μm features are etched into 30 nm deep, the etching depth for the 200 nm feature is only about 5 nm.

We claim:

1. A method of forming a non-optically detectable identifiable mark at an outer surface of an article formed from a solid state material, said method including the steps of:

(i) forming a plurality of recesses within a predetermined region of a photoresist applied to an outer surface of an article formed from a solid state material, wherein said plurality of recesses is formed by two-photon absorption lithography and wherein said one or more recesses extend at least partially through the photoresist and from an outer surface of the photoresist and towards said outer surface of the article formed from a solid state material; and (ii) applying an etching process to the photoresist such that at least a portion of the outer surface of said article is exposed and is further etched so as to form a plurality of etched portions extending into said article from the outer surface of the article and wherein said plurality of etched portions correspond to said plurality of recesses formed within the predetermined region of the photoresist; wherein said predetermined region of said photoresist defines an identifiable mark to be applied to the outer surface of said article;

wherein said plurality of etched portions extending into said article forms the non-optically identifiable mark on the outer surface of said article; and wherein the maximum width of the etched portions is less than 200nm such that the identifiable mark is non-optically detectable in the visible light spectrum and is viewable in the ultra-violet (UV) spectrum.

2. The method according to claim 1, wherein one or more of the recesses of said plurality of recesses extend through the photoresist and so as to provide one or more apertures therethrough and providing one or more exposed portions of said outer surface of the article prior to application of the etching process, such that such that etched portions corresponding to the one or more apertures have depths into the article of approximately the same depth.

3. The method according to claim 1, wherein the recesses extend through the photoresist at varying depths to each other prior to application of the etching process, such that the etched portions have varying depths into the article.

4. The method according to claim 1, wherein the photoresist has a thickness in the range of from 10 nm to 500 μm, wherein said recesses have a maximum width of in the range of from 10 nm to 200nm or less, and wherein said etched portions have a depth in the range of about 5 nm to about 30nm.

5. The method according to claim 1, wherein the recesses of said plurality of recesses are arranged in a non-period and non-uniform arrangement with respect to each other within said predetermined region of a photoresist.

6. The method according to claim 1, wherein said photoresist is of uniform thickness.

7. The method according to claim 1, wherein the photoresist has a non-uniform thickness.

8. The method according to claim 1, wherein the apertures of said plurality of recesses are the same width.

9. The method according to claim 1, wherein the recesses of said plurality of recesses have non-uniform widths.

10. The method according to claim 1, wherein one or more recess is formed from a plurality of adjacent recesses.

11. The method according to claim 1, wherein the etching process is a plasma etching process.

12. The method according to claim 1, wherein the etching process is Aspect Ratio Dependent Etching (ARDE) microwave plasma etching.

13. The method according to claim 12, wherein Radio Frequency (RF) bias is applied during said etching process.

14. The method according to claim 1, wherein the etching process is chosen from the group consisting of a Reactive Ion Etch (RIE) process, an Inductively-Coupled Plasma (ICP) etching process, a Focused Ion Beam (FIB) etching process, and a Helium Ion Microscope (HIM) etching process.

15. The method according to claim 1, wherein said solid state material is chosen from the group of gemstones consisting of diamond, pearl, silicon, and synthetic sapphire.

16. The method according to claim 1, wherein said solid state material is a sapphire based material, and wherein said etching process includes the presence of Chlorine gas, Boron TriChloride ($BCl_3$) gas, or combinations thereof.

17. An article formed from solid state material having a non-optically detectable identifiable mark on the outer surface of the article, wherein said mark includes a plurality of recesses extending into said article from the outer surface of the article and wherein the maximum width of the etched portions of is less than 200 nm such that the identifiable mark is non-optically detectable in the visible light spectrum and is viewable in the ultra-violet (UV) spectrum and wherein said mark is viewable in the ultra-violet spectrum irrespective of the distribution or uniformity of the etched potions in relation to each other.

18. The article according to claim 17, wherein said solid state material is chosen from the group of gemstones consisting of diamond, pearl, silicon, and synthetic sapphire.

19. The article according to claim 17, wherein the non-optically detectable identifiable mark is non-optically detectable in the visible light spectrum is viewable in the ultra-violet (UV) spectrum, and said identifiable mark is viewable by way of Differential Interference Contrast (DIC) microscopy or by way of Scanning Electron Microscopy (SEM).

20. The article according to any one of claims 17, wherein said non-optically identifiable mark is formed at the outer surface of the article in a predetermined spatial arrangement with respect to an optically identifiable mark formed on the outer surface of said article, wherein the detection of the optically detectable mark allows for subsequent detection of the non-optical mark by reference to said predetermined spatial arrangement.

* * * * *